(12) United States Patent
Gorczyca et al.

(10) Patent No.: US 10,276,486 B2
(45) Date of Patent: Apr. 30, 2019

(54) STRESS RESISTANT MICRO-VIA STRUCTURE FOR FLEXIBLE CIRCUITS

(75) Inventors: Thomas Bert Gorczyca, Schenectady, NY (US); Richard Joseph Saia, Niskayuna, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 959 days.

(21) Appl. No.: 12/715,450

(22) Filed: Mar. 2, 2010

(65) Prior Publication Data

US 2011/0215480 A1  Sep. 8, 2011

(51) Int. Cl.
*H01L 23/498* (2006.01)

(52) U.S. Cl.
CPC .... *H01L 23/4985* (2013.01); *H01L 23/49822* (2013.01); *H01L 23/49827* (2013.01); *H01L 2924/0002* (2013.01); *H01L 2924/3011* (2013.01)

(58) Field of Classification Search
CPC . H01L 2924/01078; H01L 2924/01079; H01L 2924/14; H01L 2924/15311; H01L 23/5226; H01L 23/49572; H01L 23/4985; H01L 23/49827
USPC ......... 257/700, 704, 774–775; 438/106, 118, 438/638–640, 667–669
See application file for complete search history.

(56) References Cited

U.S. PATENT DOCUMENTS

| | | | |
|---|---|---|---|
| 4,783,695 A * | 11/1988 | Eichelberger et al. | 257/668 |
| 5,055,425 A | 10/1991 | Leibovitz et al. | |
| 5,073,814 A * | 12/1991 | Cole et al. | 257/643 |
| 5,162,260 A * | 11/1992 | Leibovitz et al. | 216/18 |
| 5,354,695 A | 10/1994 | Leedy | |
| 5,946,555 A * | 8/1999 | Crumly et al. | 438/125 |

(Continued)

FOREIGN PATENT DOCUMENTS

| | | |
|---|---|---|
| EP | 0465197 A2 | 1/1992 |
| EP | 0707340 A2 | 4/1996 |

(Continued)

OTHER PUBLICATIONS

Search Report and Written Opinion from corresponding EP Application No. 11156492.8, dated Mar. 6, 2013.

(Continued)

*Primary Examiner* — Thao X Le
*Assistant Examiner* — Eric W Jones
(74) *Attorney, Agent, or Firm* — Ziolkowski Patent Solutions Group, SC

(57) ABSTRACT

A chip package is disclosed that includes an electronic chip having a plurality of die pads formed on a top surface thereof, with a polyimide flex layer positioned thereon by way of an adhesive layer. A plurality of vias is formed through the polyimide flex layer and the adhesive layer corresponding to the die pads. A plurality of metal interconnects are formed on the polyimide flex layer each having a cover pad covering a portion of a top surface of the polyimide flex layer, a sidewall extending down from the cover pad and through the via along a perimeter thereof, and a base connected to the sidewall and forming an electrical connection with a respective die pad. Each of the base and the sidewall is formed to have a thickness that is equal to or greater than a thickness of the adhesive layer.

4 Claims, 5 Drawing Sheets

(56) References Cited

U.S. PATENT DOCUMENTS

| | | | |
|---|---|---|---|
| 6,239,482 B1 | 5/2001 | Fillion et al. | |
| 6,323,096 B1* | 11/2001 | Saia et al. | 438/384 |
| 7,262,444 B2 | 8/2007 | Fillion et al. | |
| 2002/0074540 A1* | 6/2002 | Yokoyama | 257/1 |
| 2004/0050687 A1* | 3/2004 | Lee | C23C 14/345 204/192.3 |
| 2004/0188239 A1* | 9/2004 | Robison | C23C 14/345 204/192.3 |
| 2004/0211661 A1* | 10/2004 | Zhang | C23C 14/046 204/192.12 |
| 2005/0042366 A1* | 2/2005 | Itabashi et al. | 427/97.9 |
| 2008/0305582 A1 | 12/2008 | Fillion | |
| 2009/0243081 A1 | 10/2009 | Kapusta et al. | |

FOREIGN PATENT DOCUMENTS

| | | | |
|---|---|---|---|
| JP | 03136243 | A | 6/1991 |
| JP | 2002076185 | A | 3/2002 |
| JP | 2007053379 | A | 3/2007 |
| JP | 2009044092 | A | 2/2009 |

OTHER PUBLICATIONS

Unofficial English translation of Japanese Office Action issued in connection with corresponding JP Application No. 2011036498 dated Mar. 3, 2015.

* cited by examiner

STRESS RESISTANT MICRO-VIA STRUCTURE FOR FLEXIBLE CIRCUITS

BACKGROUND OF THE INVENTION

Embodiments of the invention relate generally to chip packages and, more particularly, to chip packages having vias formed through dielectric and adhesive layers down to die pads of an electronic chip, with the vias having stress-resistant metal interconnects formed therein having an increased thickness.

Advancements in integrated circuit (IC) chip packaging technology are driven by ever-increasing needs for achieving better performance, greater miniaturization and higher reliability. Most semiconductor devices, such as bare chips, have electrical contact pads or "die pads" located on a top-side or active surface of the device to provide input/output (I/O) connections. IC chips first packaging technologies such as the embedded chip build-up process (ECBU), generally apply a first dielectric layer (e.g., polyimide film) over a chip top surface, form vias in the dielectric layer such that they abut the die pads on the chip, and then form metal interconnections to the die pads along the vias and metal cover pads about the via openings on a top surface of the dielectric layer. For yield and reliability issues, the metalized cover pad generally extends beyond the opening of the via. This additional level of interconnection redistributes the peripheral bonding pads of each chip to an area array of metal pads that are evenly deployed over the chip's surface. The solder balls or bumps used in connecting the device to the application circuit board are subsequently placed over these metal pads.

As functionality on ICs/chip packages continues to increase, the number of die pads on the chip is increased and the pad pitch (i.e., the center-to-center distance between adjacent die pads) is reduced, such as to 50 micrometers or less. This reduces the space available for via interconnect to the device, forcing smaller vias to be used (i.e., vias having a smaller diameter). Often, the thickness of dielectric layers applied to the chip cannot be reduced, either because of impedance requirements between high frequency layers or due to dimension rigidity needed for pattern overlay alignment. Thus, while the diameter of the vias is reduced, the height/thickness of the vias extending through the dielectric layer remains somewhat constant, thereby resulting in vias having an increased aspect ratio (i.e., height-to-diameter ratio). Smaller diameter vias, however, are harder to fill with metal during electroplating, and the total volume of metal present within such vias may be less for a given thickness compared to larger vias. That is, while the metal cover pads about the via openings on the top surface of the dielectric layer may be of a given thickness, the thickness of metal present within a smaller diameter via may be less than the given thickness based on the smaller diameter and an increased aspect ratio, thus reducing the volume of metal in the via below what is desired.

This reduced volume of metal present in a reduced diameter via can lead to durability issues with the metal interconnect. That is, during thermal cycling reliability testing, stress from coefficient of thermal expansion (CTE) mismatch between the metal in the vias and the surrounding dielectric material eventually causes metal fatigue and cracking, resulting in loss/failure of the metal interconnect. This happens more quickly if there is less total metal present to minimize fatigue.

Accordingly there is a need for a system and method of chip packaging that provides for reliable metal interconnect connection to die pads on a chip. There is a further need for such metal interconnects to resist fatigue caused by thermal stress, especially in high density interconnect (HDI) IC packages that include vias with a reduced diameter and increased aspect ratio.

BRIEF DESCRIPTION OF THE INVENTION

Embodiments of the invention overcome the aforementioned drawbacks by providing a system and method of chip package fabrication in which vias are formed through dielectric and adhesive layers down to die pads of an electronic chip, with the vias having stress-resistant metal interconnects formed therein having an increased thickness.

In accordance with one aspect of the invention, a chip package includes an electronic chip having a plurality of die pads formed on a top surface thereof and a polyimide flex layer positioned on the electronic chip, with the polyimide flex layer having a plurality of vias formed therein such that each of the plurality of vias corresponds to a respective die pad. The chip package also includes an adhesive layer deposited between the electronic chip and the polyimide flex layer and a plurality of metal interconnects formed on the polyimide flex layer, with each of the plurality of metal interconnects further including a cover pad covering a portion of a top surface of the polyimide flex layer, a sidewall extending down from the cover pad and through the via along a perimeter thereof, and a base connected to the sidewall and forming an electrical connection with a respective die pad, wherein a thickness of each of the base and the sidewall is equal to or greater than a thickness of the adhesive layer.

In accordance with another aspect of the invention, a method of forming a chip package includes the steps of providing a silicon wafer having an integrated circuit (IC) thereon and a plurality of die pads formed on a top surface thereof, applying an adhesive layer to the top surface of the silicon wafer, adhering the silicon wafer to a free-standing polyimide flex layer by way of the adhesive layer, and forming a plurality of vias through the free-standing polyimide flex layer and the adhesive layer, with each of the plurality of vias extending to a respective one of the plurality of die pads. The method also includes the step of forming a plurality of metal interconnects on the free-standing polyimide flex layer such that each of the plurality of metal interconnects extends through a respective via to electrically connect to a respective die pad, wherein forming the plurality of metal interconnects further includes determining a desired metal interconnect thickness based on a thickness of the adhesive layer, depositing a metal material on the free-standing polyimide flex layer and in the plurality of vias having the desired metal interconnect thickness, and patterning and etching the metal material to form the plurality of metal interconnects having the desired thickness.

In accordance with yet another aspect of the invention, a chip package includes a silicon wafer having a plurality of die pads formed on a top surface thereof, an adhesive layer deposited on the silicon wafer, and a free-standing dielectric layer affixed to the adhesive layer and having a plurality of vias formed therethrough each extending through the adhesive layer to a respective one of the plurality of die pads. The chip package also includes a plurality of metal interconnects formed on the free-standing polyimide flex film such that each of the plurality of metal interconnects extends through a respective via to form an electrical connection with a respective die pad. Each of the plurality of metal interconnects further includes a cover pad covering a portion of a top surface of the free-standing polyimide flex film, a base forming an electrical connection with a respective die pad, and a sidewall extending between the cover pad and the base along a perimeter of the via, with each of the base and the sidewall being constructed to have a thickness equal to or greater than a thickness of the adhesive layer.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 2 is a cross-sectional view of an electronic chip package incorporating a laminate layer attached to a bare electronic chip according to an embodiment of the invention.

FIG. 3 is a cross-sectional view of an electronic chip package incorporating additional laminate layers according to an embodiment of the invention.

DETAILED DESCRIPTION OF THE PREFERRED EMBODIMENTS

Embodiments of the present invention provide for a system and method of forming a chip package. The chip package includes vias formed through a dielectric layer down to die pads of an electronic chip, with the vias having stress-resistant metal interconnects formed therein having an increased thickness.

Figure 1:
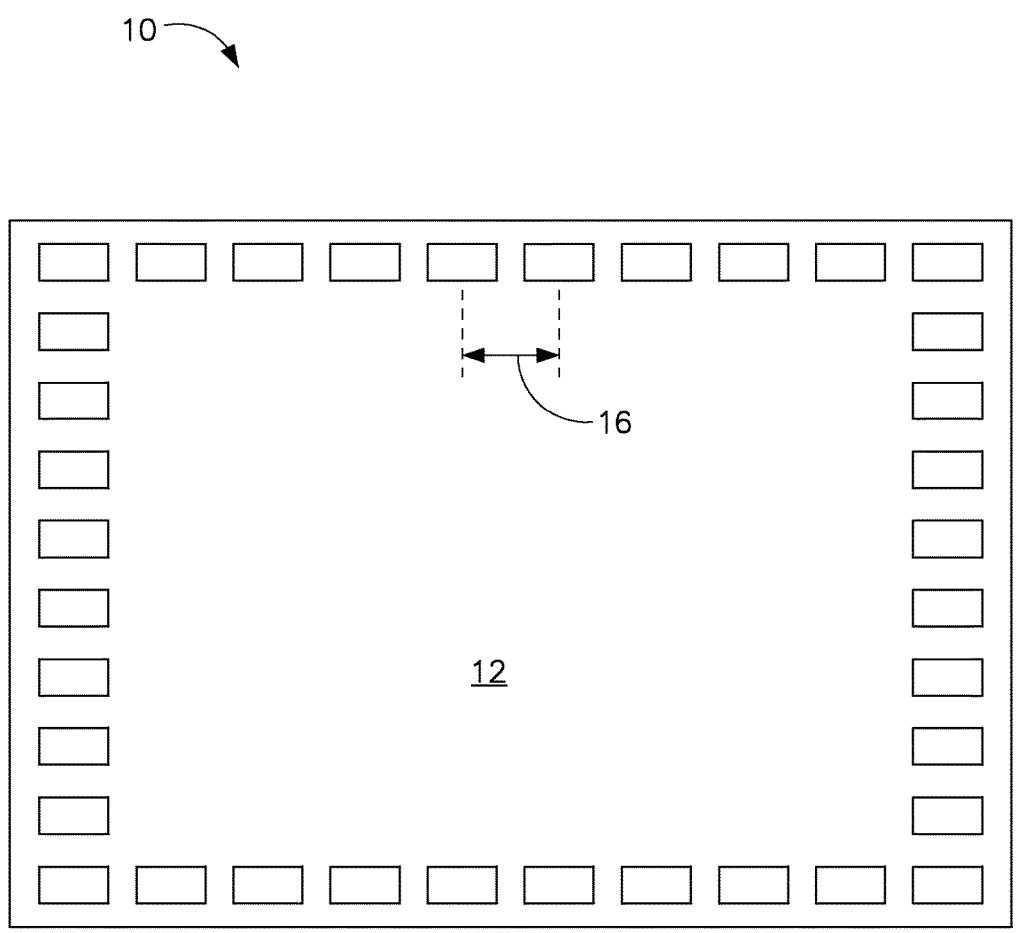
FIG. 1 is a top-side planer view of a bare electronic chip for use with embodiments of the invention.

Referring to FIG. 1, a top-side planar view of a bare or unpackaged electronic chip 10 that may be used with embodiments of the invention is shown. As shown, bare electronic chip 10 includes a substrate 12 (e.g., silicon wafer) and a plurality of die pads 14 thereon. Die pads 14 may be placed on substrate 12 by a variety of techniques. For example, a metallization process or the like may be implemented to deposit die pads 14 onto substrate 12. Alternative techniques such as etching or photolithography may also be implemented. Die pads 14 may have a composition that includes a variety of materials such as, for example, aluminum, copper, gold, silver, and nickel, or combinations thereof. As shown in FIG. 1, die pads 14 are arranged on substrate 12 such that they are spaced relative to one another. As such, each consecutive die pad 14 has a pitch 16 therebetween.

Embodiments of the invention may use bare electronic chips having their die pads arranged in a manner different than that shown in FIG. 1. For example, other bare electronic chips may have multiple perimeter rows of die pads, rather than the single rows of die pads 14 shown in FIG. 1. Additionally, semiconductor devices may be used that have arrays of die pads located on any region of a substrate or one or more rows of die pads generally arranged over the center region of the substrate. Further embodiments may have die pads arranged along less than all four side of the perimeter of a substrate. Still further, embodiments of electronic chips may include die pads arranged such that the spacing between die pads varies.

Figures 2, 3:
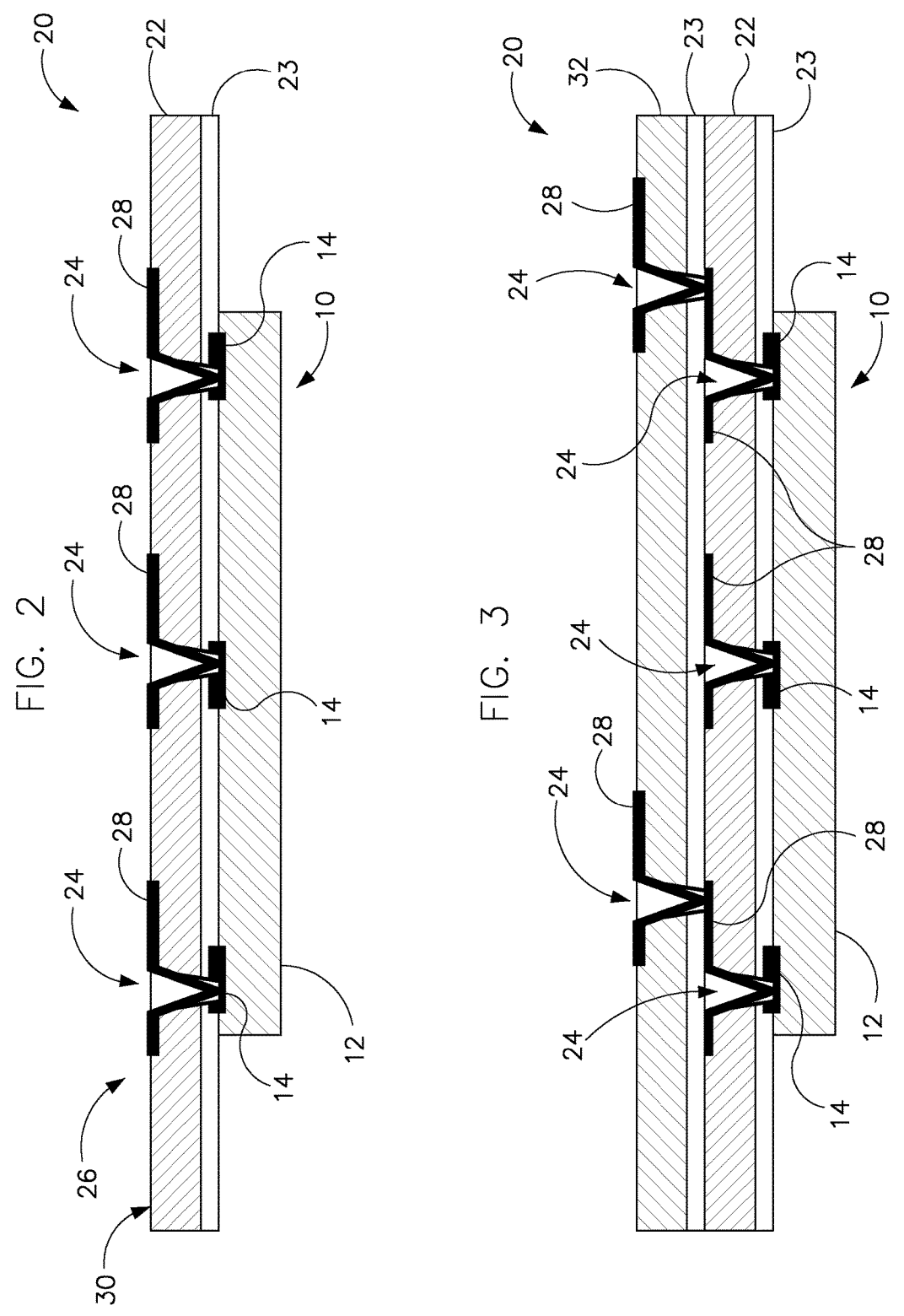

Referring now to FIG. 2, a side view of a chip package 20 (i.e., integrated circuit (IC) package) is shown incorporating bare electronic chip 10. In manufacturing chip package 20, a free-standing dielectric layer, such as a polyimide flex layer or circuit board 22, is applied to a top surface of bare electronic chip 10 by way of an adhesive layer 23 applied therebetween, with the bare electronic chip 10 being attached to the adhesive layer 23 in a face-down orientation using a die attach mechanism (not shown) or some similar procedure. The polyimide flex layer 22 is in the form of a pre-formed laminate sheet or film that can be placed on bare electronic chip 10. For example, the polyimide flex layer 22 can be formed of Kapton®, Ultem®, polytetrafluoroethylene (PTFE), or another polymer film, such as a liquid crystal polymer (LCP). According to an exemplary embodiment, adhesive layer 23 is comprised of an epoxy-based dielectric material, an epoxy resin, a photoacid generator, an antioxidant, and a cold catalyst corresponding to the photoacid generator, so as to provide an adhesive that promotes product reliability and yield. Adhesive layer is formed to have a thickness that provides for adequate bonding between polyimide flex layer 22 and electronic chip 10, such as a thickness in the range of 12 to 25 micrometers, for example.

Upon application of polyimide flex layer 22 to bare electronic chip 10 by way of adhesive layer 23, a plurality of vias 24 are formed in the laminate layer. The vias 24 are formed by way of a laser ablation or laser drilling process and are formed at positions corresponding to die pads 14 located on substrate 12. Laser drilling of vias 24 in polyimide flex layer 22 thus serves to expose the die pads 14.

Upon formation of vias 24, a metal layer/material 26 is applied onto polyimide flex layer 22 by way of, for example, a sputtering process, electroplating process, or combination of the two. The deposited metal layer/material 26 is then formed into metal interconnects 28. In one exemplary technique, metal layer/material 26 is patterned and etched such that metal interconnects 28 are formed that extend from a top surface 30 of polyimide flex layer 22 and down through vias 24. Metal interconnects 28 thus form an electrical connection with die pads 14. In this manner, polyimide flex layer 22 forms a re-distribution layer that acts to redistribute the arrangement of die pads 14, which may (as shown in FIG. 1) be arranged about a periphery of each bare electronic chip 10, into an area array of interconnects distributed over the surface of electronic chip package 20.

As shown in FIG. 3, one or more additional polyimide flex layers 32 are applied on polyimide flex layer 22 by way of associated adhesive layers 23 during construction of chip package 20, according to an embodiment of the invention. Similar to the steps set forth above, a plurality of vias 24 are formed in the additional polyimide flex layers 32 by way of, for example, a laser ablation or laser drilling process. The vias 24 in each of the additional polyimide flex layers 32 are formed at positions corresponding to metal interconnects 28 attached to a polyimide flex layer (e.g., polyimide flex layer 22) positioned immediately therebelow so as to allow for the further re-distribution of the metal interconnects 28. As further set forth above, metal interconnects are then again formed on the additional polyimide flex layer 32 via a deposition (e.g., sputtering or electroplating) process and subsequent patterning and etching process, so as to deform metal interconnects 28 to extend down through vias 24 and into electrical contact with metal interconnects 28 on a polyimide flex layer 22, 32 positioned immediately therebelow.

Figure 4:
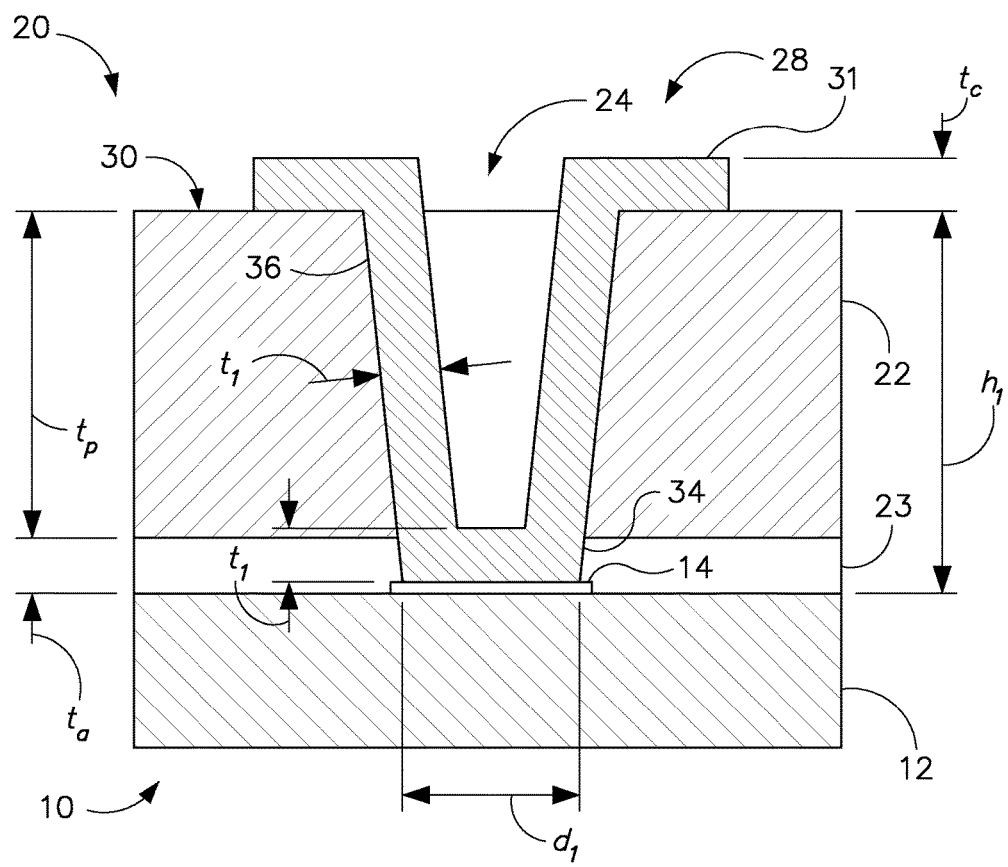
FIG. 4 is a cross-sectional view of a partial electronic chip package illustrating via diameter and metal interconnect thickness according to an embodiment of the invention.
Figure 5:
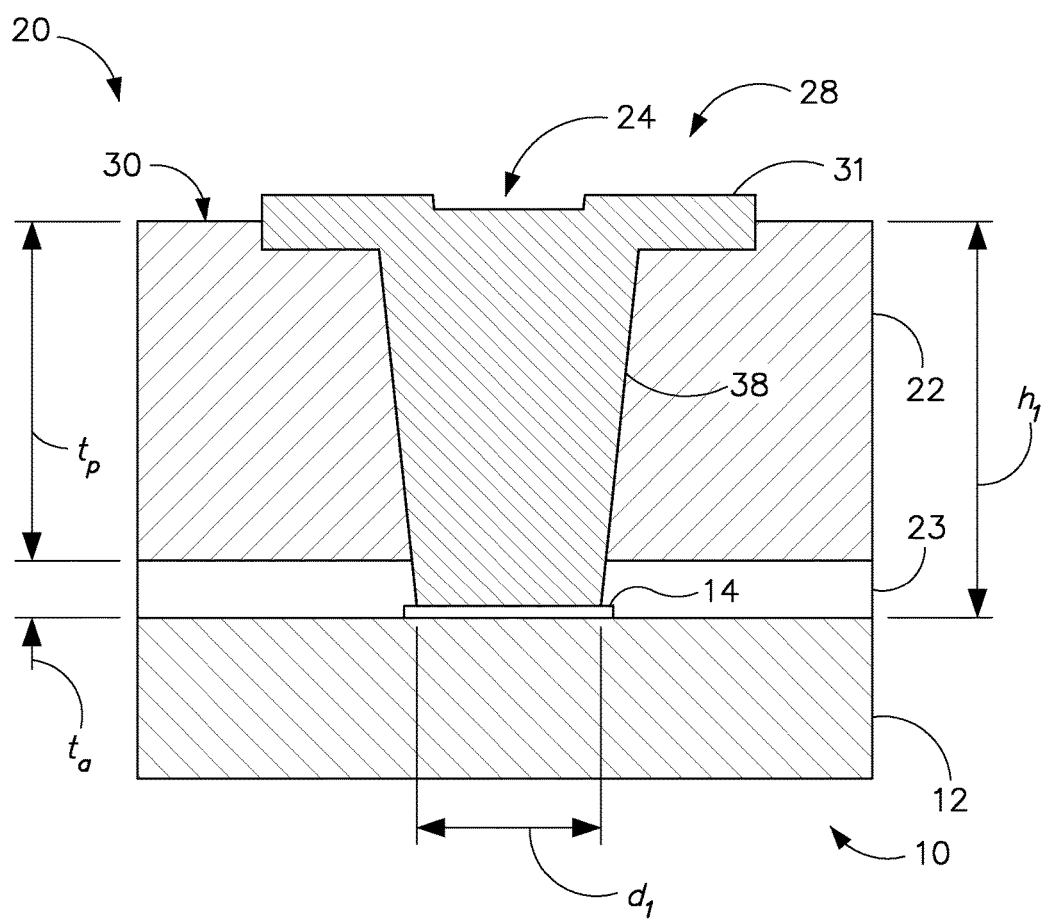
FIG. 5 is a cross-sectional view of a partial electronic chip package illustrating via diameter and metal interconnect thickness according to another embodiment of the invention.

Referring now to FIGS. 4 and 5, detailed views of a portion of chip package 20 are shown according to embodiments of the invention. For each of the embodiments of chip package 20 shown and described in FIGS. 4 and 5, a thickness of metal interconnect 28 is dependent on a thickness of the adhesive layer 23 applied between substrate 12 and polyimide flex layer 22. That is, it is recognized that there is a high coefficient of thermal expansion (CTE) mismatch between the metal interconnect 28 formed in via 24 and the adhesive material forming layer 23. This high CTE mismatch can induce stress on metal interconnect 28, eventually causing metal fatigue and cracking and resulting in loss/failure of the metal interconnect. Thus, it is desired to provide a metal interconnect 28 having an increased thickness that fills a larger percentage volume of via 24 (or completely fills the vias) to provide improved resistance to metal fatigue and cracking, as compared to a thinner metal interconnect.

Referring to FIG. 4, a chip package 20 is provided according to an embodiment of the invention that includes a polyimide flex layer 22 formed to have a thickness $t_p$ of 25 micrometers, such that it is constructed as a free-standing film to which electronic chip 10 can be affixed. Adhesive layer 23 positioned between electronic chip 10 and polyimide flex layer 22 has a thickness $t_a$ of approximately 14 micrometers, so as to provide adequate bonding between polyimide flex layer 22 and electronic chip 10. Accordingly, via 24 formed through polyimide flex layer 22 and adhesive layer 23 has a height $h_1$ of approximately 39 micrometers.

A metal interconnect 28 is formed on polyimide flex layer 22 and in via 24 by application of a metal layer/material, such as by an electroplating process and subsequent patterning and etching. Metal interconnect 28 is formed to include a cover pad 31 formed on top surface 30 of polyimide flex layer 22, a base section 34 that forms an electrical connection with die pad 14, and a sidewall 36 extending up from the base 34 along a perimeter of the via 24 and onto top surface 30 of polyimide flex layer 22. According to the embodiment of FIG. 4, base 34 and sidewall 36 of metal interconnect 28 are formed to have a thickness $t_1$ in the range of 14 micrometers, so as to provide a metal interconnect 28 resistant to metal fatigue and cracking that may occur based on stresses imparted to the metal interconnect from a CTE mismatch between the metal forming metal interconnect 28 and the surrounding materials forming polyimide flex layer 22 and adhesive 23. That is, for a via 24 formed having a height $h_1$ of approximately 39 micrometers, where a thickness $t_a$ of adhesive layer 23 is 14 micrometers, a metal interconnect 28 having a base 34 and sidewall 36 thickness $t_1$ of 14 micrometers provides a metal interconnect having improved reliability with increased resistance to failure resulting from thermal cycling.

With respect to FIG. 4, it is recognized that an adhesive layer 23 may be provided between substrate 12 and polyidmide flex layer 22 having a thickness $t_a$ greater or lesser than 14 micrometers. In general, it is recognized that a thickness $t_1$ of base 34 and sidewall 36 of metal interconnect 28 should be equal to or greater than a thickness $t_a$ of adhesive layer 23. Thus, for example, for an adhesive layer 23 having a thickness $t_a$ of 16 micrometers, a metal interconnect 28 having a base 34 and sidewall 36 with a thickness $t_1$ of at least 16 micrometers would be provided, according to an embodiment of the invention. Providing a metal interconnect 28 having a base 34 and sidewall 36 with a thickness $t_1$ equal to or greater than a thickness $t_a$ of adhesive layer 23, provides a reliable, stress-resistant metal interconnect 28.

Referring now to FIG. 5, a chip package 20 is provided according to another embodiment of the invention that includes a polyimide flex layer 22 having a thickness $t_p$ of 25 micrometers, such that it is constructed as a free-standing film to which electronic chip 10 can be affixed. An adhesive layer 23 positioned between electronic chip 10 and polyimide flex layer 22 has a thickness $t_a$ of approximately 14 micrometers, so as to provide adequate bonding between polyimide flex layer 22 and electronic chip 10. Accordingly, via 24 formed through polyimide flex layer 22 and adhesive layer 23 has a height $h_1$ of approximately 39 micrometers.

According to the embodiment of FIG. 5, a metal interconnect 28 is provided having a cover pad 31 formed on top surface 30 of polyimide flex layer 22, along with a "base section" and "sidewall" in the form of a post interconnect 38 that fills (or substantially fills) via 24. A variety of "solid via plating" metallization techniques may be implemented to create post interconnect 38, such as by forming a solid metal in via 24 by implementing a selective pattern plate-up of the via metal or, through mechanisms of differential etching and plating rates, implement a pulsed plating that alternately plates and etches metal. Thus, post interconnect 38 can be described as a metal interconnect 28 having a "base section" and "sidewall" having a great enough thickness that via 24 is substantially or completely filled, thereby forming a post interconnect. As post interconnect 38 fills via 24, it has a "thickness" greater than the thickness $t_a$ of adhesive layer 23, and thus provides a metal interconnect having improved reliability with increased resistance to failure resulting from thermal cycling.

For each of the embodiments set forth in FIGS. 4 and 5, it is recognized that a diameter $d_1$ and aspect ratio (ratio of height to diameter) of via 24 may affect formation of the metal interconnect 28 during an electroplating process. For a high-density interconnect chip package where the pitch 16 (FIG. 1) between die pads 14 is decreased, it is recognized that a diameter $d_1$ of each via 24 is also decreased in order to allow for formation of vias corresponding to die pads 14 and the minimized pitch therebetween. However, while the diameter $d_1$ of via 24 can be reduced in order to provide for an electrical connection to die pad 14 of electronic chip 10, there are limits regarding a reduction in a thickness $t_p$ of polyimide flex layer 22 (e.g., a minimum polyimide flex layer thickness of 25 micrometers), either because of impedance requirements between high frequency layers or due to dimensional rigidity needed for pattern overlay alignment. Therefore, a reduction in the diameter $d_1$ of each via 24 results in a via having an increased aspect ratio (i.e., ratio of height to diameter).

The decreased diameter $d_1$ and increased height-to-diameter aspect ratio of via 24 makes it harder to fill via 24 with metal during electroplating, thereby causing inconsistencies in the thickness of portions of metal interconnect 28. More specifically, the decreased diameter $d_1$ and increased height-to-diameter aspect ratio of via 24 can lead to a thickness $t_c$ of cover pad 31 being greater than a thickness $t_1$ of base 34 and sidewall 36. For example, such as shown in FIG. 4, for a via 24 formed having a bottom diameter $d_1$ of 25 micrometers and a height of 39 micrometers, a thickness $t_c$ of cover pad 31 may be 8 micrometers while a thickness $t_1$ of base 34 and sidewall 36 may be approximately 5.5 micrometers, based on the inherent difficulty of filling via 24 with metal during electroplating.

Figure 6A:
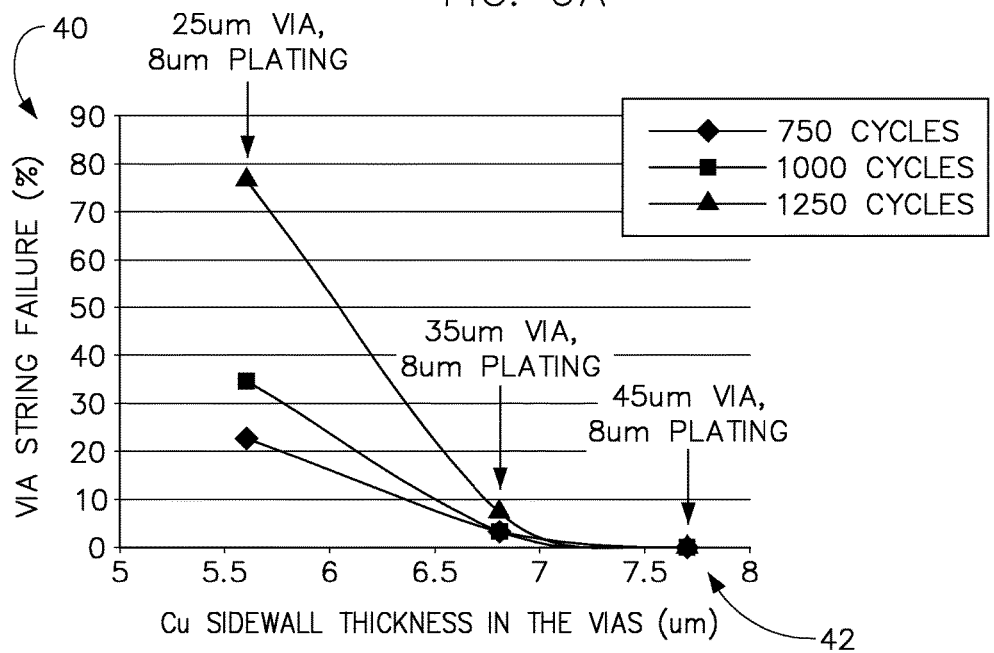
FIGS. 6A and 6B are graphs illustrating a relationship between metal interconnect failure percentage and metal interconnect base and sidewall thickness.
Figure 6B:
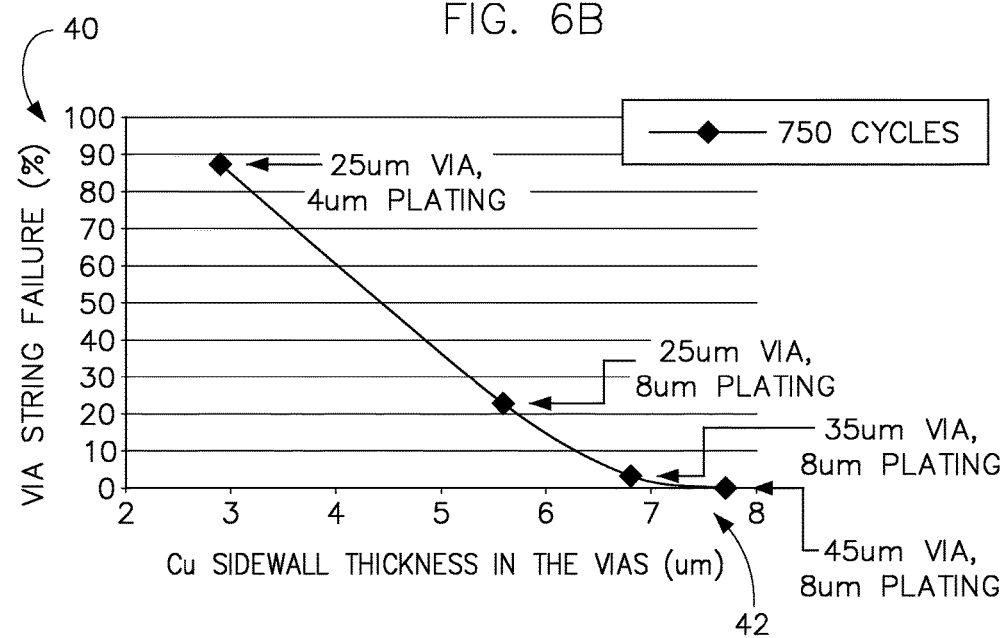

Referring now to FIGS. 6A and 6B, and with continued reference to FIGS. 4 and 5, the relationship between metal interconnect reliability and a thickness $t_1$ of base 34 and sidewall 36 is illustrated, with a via string failure percentage axis 40 being plotted against a base/sidewall thickness axis 42. As examples, a via string failure percentage is shown in FIG. 6A for a 8 micrometer top surface metal interconnect plating (i.e., a thickness of cover pad 31 of the metal interconnect) of a plurality of via sizes, including: a 25 micrometer diameter via, a 35 micrometer diameter via, and a 45 micrometer diameter via, with via string failure percentage being illustrated for thermal cycling of 750 cycles, 1000 cycles, and 1250 cycles. As shown in FIG. 6A, the actual thickness $t_1$ of the base/sidewall 34, 36 formed by the 8 micrometer top surface plating varies based on the via diameter, with the base/sidewall thickness in the 25 micrometer via being approximately 5.6 micrometers, the base/sidewall thickness in the 35 micrometer via being approximately 6.8 micrometers, and the base/sidewall thickness in the 45 micrometer via being approximately 7.7 micrometers.

Referring now to FIG. 6B, a via string failure percentage for thermal cycling of 750 cycles is shown for a 8 micrometer top surface metal interconnect plating of a plurality of via sizes, including: a 25 micrometer diameter via, a 35 micrometer diameter via, and a 45 micrometer diameter via, for thermal cycling of 750 cycles. Additionally, a via string failure percentage for thermal cycling of 750 cycles is shown for a 4 micrometer top surface metal interconnect plating of a 25 micrometer diameter via. As shown in FIG. 6B, the actual thickness $t_1$ of the base/sidewall 34, 36 formed by the 8 micrometer plating varies based on the via diameter, with the base/sidewall thickness in the 25 micrometer via being approximately 5.6 micrometers, the base/sidewall thickness in the 35 micrometer via being approximately 6.8 micrometers, and the base/sidewall thickness in the 45 micrometer via being approximately 7.7 micrometers. For the 4 micrometer plating in the 25 micrometer via, the base/sidewall thickness is approximately 2.9 micrometers.

Based on FIGS. 6A and 6B, it can be seen that the via string failure percentage (i.e., metal interconnect reliability) is a function of the thickness $t_1$ of base/sidewall 34/36 of the metal interconnect, and is independent from the metal interconnect plating thickness (i.e., thickness $t_c$ of cover pad 31) and the via diameter. That is, the thickness $t_c$ of cover pad 31 of the metal interconnect 28 and the diameter $d_1$ of via 24 do not affect metal interconnect reliability. Rather, it is the thickness $t_1$ of the metal interconnect base and sidewall 34, 36 within via 24, a desired value of which is determined based on a thickness $t_a$ of adhesive layer 23, that determines reliability of the metal interconnect 28 and resistance to failure resulting from thermal cycling.

Thus, it is recognized that in forming metal interconnects 28, it is the thickness $t_1$ of base 34 and sidewall 36 that is taken into account when electroplating a metal material onto polyimide flex layer 22 and into via 24. As the reliability of the metal interconnect 28 during thermal cycling is dependent on the total volume of metal present within via 24 (i.e., the thickness $t_1$ of base 34 and sidewall 36), it is the thickness $t_1$ of base 34 and sidewall 36 relative to the thickness $t_a$ of adhesive layer 23 that is taken into account, rather than a thickness $t_c$ of cover pad 31 formed on top surface 30 of polyimide flex layer 22. Accordingly, during electroplating, an amount of metal material 26 is applied sufficient to form a base 34 and sidewall 36 of metal interconnect 28 having a desired thickness $t_1$ (i.e., a thickness $t_1$ equal to or greater than a thickness $t_a$ of adhesive layer 23), or entirely filling via 24 (i.e., post interconnect 38) and it is recognized that a thickness $t_c$ of cover pad 31 may be larger than a thickness of base 34 and sidewall 36.

Therefore, according to one embodiment of the invention, a chip package includes an electronic chip having a plurality of die pads formed on a top surface thereof and a polyimide flex layer positioned on the electronic chip, with the polyimide flex layer having a plurality of vias formed therein such that each of the plurality of vias corresponds to a respective die pad. The chip package also includes an adhesive layer deposited between the electronic chip and the polyimide flex layer and a plurality of metal interconnects formed on the polyimide flex layer, with each of the plurality of metal interconnects further including a cover pad covering a portion of a top surface of the polyimide flex layer, a sidewall extending down from the cover pad and through the via along a perimeter thereof, and a base connected to the sidewall and forming an electrical connection with a respective die pad, wherein a thickness of each of the base and the sidewall is equal to or greater than a thickness of the adhesive layer.

According to another embodiment of the invention, a method of forming a chip package includes the steps of providing a silicon wafer having an integrated circuit (IC) thereon and a plurality of die pads formed on a top surface thereof, applying an adhesive layer to the top surface of the silicon wafer, adhering the silicon wafer to a free-standing polyimide flex layer by way of the adhesive layer, and forming a plurality of vias through the free-standing polyimide flex layer and the adhesive layer, with each of the plurality of vias extending to a respective one of the plurality of die pads. The method also includes the step of forming a plurality of metal interconnects on the free-standing polyimide flex layer such that each of the plurality of metal interconnects extends through a respective via to electrically connect to a respective die pad, wherein forming the plurality of metal interconnects further includes determining a desired metal interconnect thickness based on a thickness of the adhesive layer, depositing a metal material on the free-standing polyimide flex layer and in the plurality of vias having the desired metal interconnect thickness, and patterning and etching the metal material to form the plurality of metal interconnects having the desired thickness.

According to yet another embodiment of the invention, a chip package includes a silicon wafer having a plurality of die pads formed on a top surface thereof, an adhesive layer deposited on the silicon wafer, and a free-standing dielectric layer affixed to the adhesive layer and having a plurality of vias formed therethrough each extending through the adhesive layer to a respective one of the plurality of die pads. The chip package also includes a plurality of metal interconnects formed on the free-standing polyimide flex film such that each of the plurality of metal interconnects extends through a respective via to form an electrical connection with a respective die pad. Each of the plurality of metal interconnects further includes a cover pad covering a portion of a top surface of the free-standing polyimide flex film, a base forming an electrical connection with a respective die pad, and a sidewall extending between the cover pad and the base along a perimeter of the via, with each of the base and the sidewall being constructed to have a thickness equal to or greater than a thickness of the adhesive layer.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method of forming a chip package comprising:
providing a silicon wafer having an integrated circuit (IC) thereon and a plurality of die pads formed on a top surface thereof;
applying an adhesive layer to the top surface of the silicon wafer;
adhering the silicon wafer to a free-standing polyimide flex layer by way of the adhesive layer;
forming a plurality of vias through the free-standing polyimide flex layer and the adhesive layer, each of the plurality of vias extending to a respective one of the plurality of die pads; and
forming a plurality of metal interconnects on the free-standing polyimide flex layer such that each of the plurality of metal interconnects extends through a respective via to electrically connect to a respective die pad, wherein forming the plurality of metal interconnects comprises:
determining a desired metal interconnect thickness based on a thickness of the adhesive layer;
depositing a metal material on the free-standing polyimide flex layer and in the plurality of vias having the desired metal interconnect thickness; and
patterning and etching the metal material to form the plurality of metal interconnects having the desired metal interconnect thickness;
wherein upon patterning and etching the metal material to form the plurality of metal interconnects, a void remains within each of the plurality of vias that is free of a metallic material; and
wherein depositing, patterning, and etching each of the plurality of metal interconnects comprises:
forming a cover pad covering a portion of a top surface of the free-standing polyimide flex layer;
forming a sidewall extending down from the cover pad and through a respective via along a perimeter thereof; and
forming a base connected to the sidewall and forming an electrical connection with a respective die pad;
wherein the sidewall and the base are formed to have the determined desired metal interconnect thickness, with the sidewall and the base having an identical thickness that is equal to or greater than a thickness of the adhesive layer; and
wherein forming the cover pad comprises forming a cover pad having a thickness greater than the thickness of the sidewall and base.

2. The method of claim 1 wherein adhering the silicon wafer to the free-standing polyimide flex layer comprises adhering the silicon wafer to the free-standing polyimide flex layer in a face-down orientation.

3. The method of claim 1 wherein applying the adhesive layer comprises applying an adhesive layer having a composition of an epoxy-based dielectric material, an epoxy resin, a photoacid generator, an antioxidant, and a cold catalyst corresponding to the photoacid generator.

4. The method of claim 1 wherein depositing the metal material comprises electroplating the metal material on the free-standing polyimide flex layer and in the plurality of vias.

* * * * *